(12) United States Patent
Kovatchev et al.

(10) Patent No.: US 9,521,716 B2
(45) Date of Patent: Dec. 13, 2016

(54) DEVICE FOR CONTROLLING A FIELD EFFECT TRANSISTOR

(71) Applicant: CONTINENTAL AUTOMOTIVE GMBH, Hannover (DE)

(72) Inventors: Emil Kovatchev, Vienna (AT); Aurel-Vasile Neic, Kasten bei Boeheimkirchen (AT)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 14/653,986

(22) PCT Filed: Nov. 14, 2013

(86) PCT No.: PCT/EP2013/073791
§ 371 (c)(1),
(2) Date: Jun. 19, 2015

(87) PCT Pub. No.: WO2014/095173
PCT Pub. Date: Jun. 26, 2014

(65) Prior Publication Data
US 2016/0192447 A1    Jun. 30, 2016

(30) Foreign Application Priority Data

Dec. 19, 2012 (DE) .................. 10 2012 223 816

(51) Int. Cl.
| | | |
|---|---|---|
| *H05B 37/02* | (2006.01) | |
| *H05B 33/08* | (2006.01) | |
| *H03K 17/06* | (2006.01) | |
| *H03K 19/0185* | (2006.01) | |

(52) U.S. Cl.
CPC ........ *H05B 33/0815* (2013.01); *H03K 17/063* (2013.01); *H03K 19/018521* (2013.01); *H05B 33/083* (2013.01); *H05B 33/0812* (2013.01); *Y02B 20/343* (2013.01)

(58) Field of Classification Search
CPC .................................. H05B 33/08; G09G 3/32
USPC ....................... 315/294, 306, 307; 345/76, 82
See application file for complete search history.

(56) References Cited

U.S. PATENT DOCUMENTS

| | | | |
|---|---|---|---|
| 4,683,438 | A | 7/1987 | Hauenstein |
| 5,365,118 | A | 11/1994 | Wilcox |
| 6,008,687 | A | 12/1999 | Orita et al. |
| 6,057,726 | A | 5/2000 | Sumida |
| 6,897,838 | B2 * | 5/2005 | Okamoto ............. G09G 3/3258 345/76 |
| 7,019,579 | B2 | 3/2006 | Bolz et al. |
| 7,046,050 | B1 | 5/2006 | Schottler |
| | | (Continued) | |

FOREIGN PATENT DOCUMENTS

| | | |
|---|---|---|
| DE | 198 14 675 A1 | 10/1998 |
| DE | 102 52 827 B3 | 8/2004 |
| JP | 2012028184 A | 2/2012 |

*Primary Examiner* — Tung X Le
(74) *Attorney, Agent, or Firm* — Laurence A. Greenberg; Werner H. Stemer; Ralph E. Locher

(57) ABSTRACT

A device for actuating at least one field effect transistor corresponding to a control signal present at a control line, includes at least one driver circuit having a current mirror with an input side and an output side. Both the input side and the output side are connected to a supply voltage, the input side is connected to the control line via a level converter and the output side is connected to the at least one FET.

10 Claims, 2 Drawing Sheets

(56) References Cited

U.S. PATENT DOCUMENTS

| | | | |
|---|---|---|---|
| 2005/0068275 A1* | 3/2005 | Kane | G09G 3/3283 |
| | | | 345/82 |
| 2005/0280440 A1 | 12/2005 | Fukazawa et al. | |
| 2006/0077134 A1* | 4/2006 | Hector | G09G 3/3233 |
| | | | 345/76 |
| 2008/0265981 A1 | 10/2008 | Niessen et al. | |
| 2009/0046090 A1* | 2/2009 | Fish | G09G 3/3233 |
| | | | 345/214 |
| 2009/0195191 A1* | 8/2009 | Lin | H05B 33/0818 |
| | | | 315/307 |
| 2010/0181924 A1 | 7/2010 | Van Woudenberg et al. | |
| 2013/0049599 A1* | 2/2013 | Logiudice | H05B 33/083 |
| | | | 315/122 |

* cited by examiner

DEVICE FOR CONTROLLING A FIELD EFFECT TRANSISTOR

BACKGROUND OF THE INVENTION

Field of the Invention

The invention relates to a device for actuating at least one field-effect transistor (FET) corresponding to a control signal present at a control line, with a supply voltage and at least one driver circuit. Such a device is intended to be used in particular for operating light-emitting diodes (LEDs), preferably for motor vehicle luminaires.

A driver circuit is required in the actuation of an N-channel FET whenever the required voltage for turning on the FET is above its source potential. This situation often occurs, for example, in the case of the actuation of light-emitting diodes (LEDs) since LEDs are usually connected in series owing to their voltage/current characteristic and are operated using a constant current source in order to achieve a constant luminosity. Actuation of individual LEDs can take place in this configuration using FETs which are connected in parallel with the LEDs, so that the drain-source channel of a FET bypasses an LED if required and therefore causes it to extinguish. Correspondingly, the source potentials of the FETs are very different and are sometimes markedly above ground potential. The invention therefore relates in particular to a device for controlling the LEDs in an LED string.

Switching or bypassing LEDs by means of FETs is an attractive form of individual LED actuation. By quickly switching over the FET, typically at a frequency of 200 Hz or more (rapid pulse width modulation; PWM), the assigned LED is correspondingly switched over inversely and the perceived average of the LED luminosity is influenced. Such actuation makes it possible to implement different lighting scenarios, not only by virtue of different luminosity, but also by virtue of the physical distribution of the LEDs. In this way, complicated light functions, such as highway light, poor weather light and cornering light, can be realized without any movement of mechanical parts, which enables an appropriate way of driving and ultimately increases road safety.

Driver circuits which enable the required voltage matching of the control signal are already known from the prior art. U.S. Pat. No. 7,046,050 B1 is based, for example, on the principle of a push-pull output stage, which is fed by a supply voltage. The gate actuation voltage is the sum of an external voltage and a pump voltage provided by a charge pump which is part of the driver circuit. The control signal is transmitted by a level converter to the input of the push-pull output stage and referenced on the supply voltage thereof. U.S. Pat. No. 4,683,438 A likewise describes a driver circuit comprising a charge pump and a level converter for transmitting the control pulses of a microcontroller. One disadvantage with the two apparatuses is the charge pump that is required, which makes the driver circuit intensive in terms of component parts and therefore cost-inefficient, in particular owing to the pulse generators required. In addition, the capacitors cause high charge-reversal currents and steep edges, which results in interference and in reduced electromagnetic compatibility of the entire circuit.

An apparatus comprising strictly speaking two driver circuits is disclosed in U.S. Pat. No. 5,365,118 A. The supply voltage of the upper driver circuit is provided by a "bootstrap circuit", which nevertheless can only function when the signal at the output oscillates with a sufficient amplitude in order that the bootstrap capacitor can be charged. Otherwise, a charge pump is additionally required in order to permanently turn on a FET.

BRIEF SUMMARY OF THE INVENTION

In contrast, the object of the invention consists in providing a cost-efficient device which is as simple as possible for actuating FETs which is insensitive to interference and voltage fluctuations and at the same time operates quickly. Likewise, the object of the invention consists in providing an alternative solution which markedly differs from the known devices.

These objects are achieved in the case of a device of the type mentioned at the outset in accordance with the invention by virtue of the fact that the driver circuit has a current mirror having an input side and an output side, wherein the two sides are connected to the supply voltage, and wherein the input side is connected via a level converter to the control line, and the output side is connected to the at least one FET. The current regulation achieved by this circuit is advantageously insensitive to fluctuations in the supply voltage.

In a preferred variant, the current mirror has a transistor pair, preferably a double transistor, comprising an input-side transistor and an output-side transistor, whose base connections are connected to one another and to the collector connection of the input-side transistor. Such a current mirror can be implemented in a particularly simple and compact manner, for example in an integrated circuit, and is therefore comparatively cost-efficient.

For particularly simple regulation of the current on the input side of the current mirror, the level converter can have a level converter transistor and at least one level converter resistor, wherein the level converter transistor is connected in series with the input side of the current mirror, and the control line is connected to the base connection of the level converter transistor. The current impressed on the input side is therefore only dependent on the voltage of the control signal and is virtually uninfluenced by fluctuations in the supply voltage.

It has proven to be favorable in this connection if the level converter transistor is connected to the input side of the current mirror via a collector resistor for reducing the power loss at the level converter transistor. The reduction in the power loss is achieved by matching of the voltage difference at the level converter transistor by the collector resistor. The referencing with respect to the source connection of the FET can advantageously be achieved by virtue of the fact that the output side of the current mirror is connected to the gate connection and to the source connection of the at least one FET, wherein a resistor is connected between the gate connection and the source connection of the FET. In this way, the gate voltage is related to any desired "floating" source potential of the FET, wherein the supply voltage needs to be greater than the sum of the source potential and the threshold voltage of the FET.

Furthermore, the input side of the current mirror can be connected to the supply voltage via an input series resistor and/or the output side can be connected to the supply voltage via an output series resistor. The resistors effect local negative feedback and thus improve the stability and accuracy of the circuit further still.

Preferably, the supply voltage can be the output voltage of a charge pump or a boost converter. This is a favorable possibility of generating a sufficiently high supply voltage using conventional means from a lower mains voltage. The use of a boost converter has the additional advantage here that no settling or charging times need to be taken into consideration and therefore constantly quick switching is ensured.

The present driver circuit is particularly suitable for applications in which the at least one FET is an N-channel FET (N-FET), in particular with a floating source potential with respect to the control input. N-FETs are much less expensive and at the same time have a lower resistance than comparable P-FETs. For physical reasons, the control signals of an N-FET need to have an amplitude which is slightly higher than the source potential.

If the at least one FET is designed for bypassing in each case at least one light-emitting diode (LED), the device can advantageously be used for controlling individual LEDs. Control by means of bypassing is aimed in particular at series-connected LED chains or LED strings.

It is furthermore favorable if two or more driver circuits with a common supply voltage are connected and actuate FETs, which for their part are preferably connected in parallel with LEDs arranged in at least one series circuit. In comparison with the prior art, in accordance with which each driver circuit generates its local supply voltage itself, the use of a common supply voltage can reduce the complexity of the entire circuit and thus also reduce the manufacturing complexity and the associated costs. The driver circuits with a common supply can in this case be designed for actuating LEDs arranged in a (series) LED string or in an LED matrix consisting of a plurality of LED strings connected in parallel.

BRIEF DESCRIPTION OF THE SEVERAL VIEWS OF THE DRAWING

The invention will be explained in more detail below with reference to particularly preferred exemplary embodiments, to which the invention is not intended to be restricted, however, and with reference to the drawings, in which specifically.

DESCRIPTION OF THE INVENTION

Figure 1:
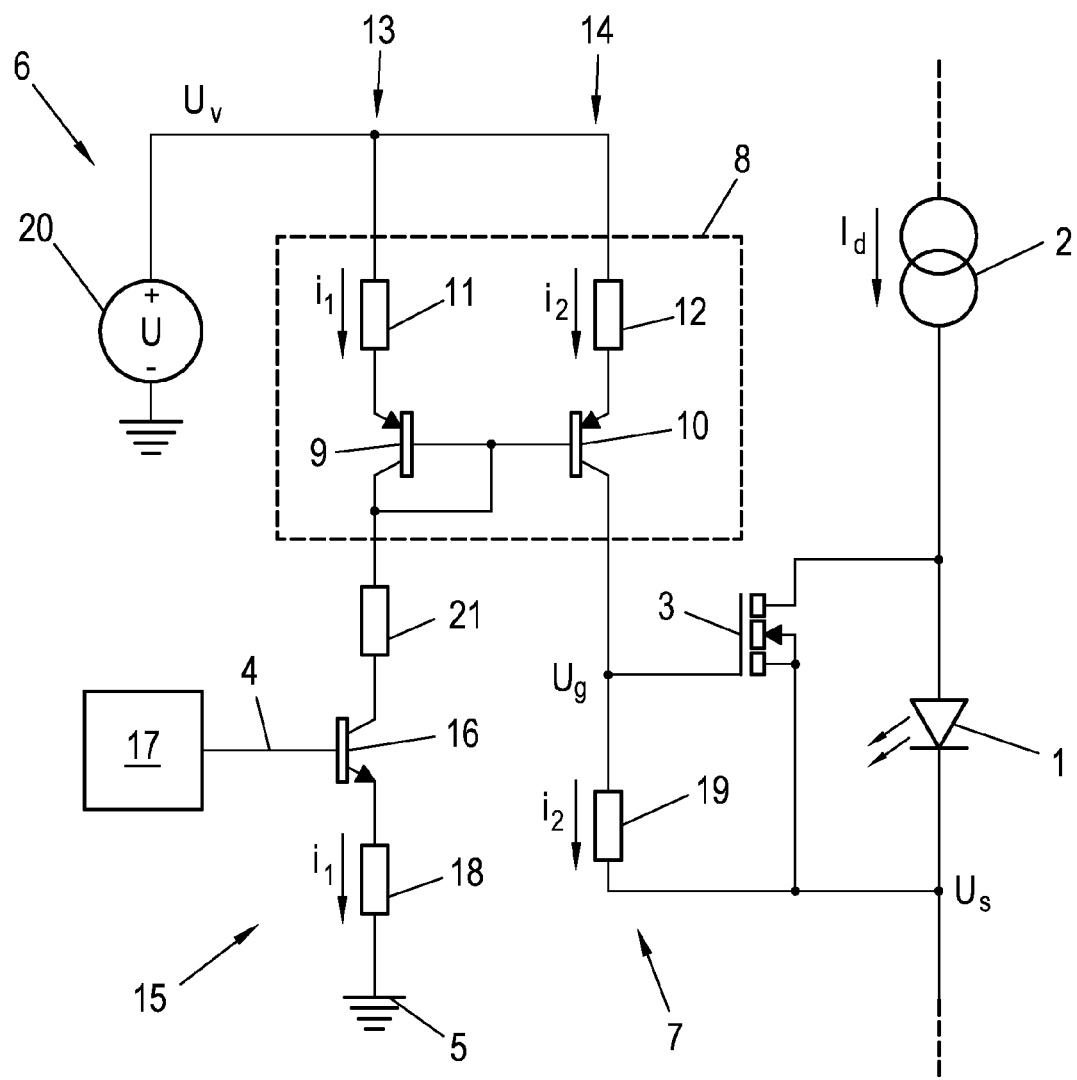
FIG. 1 shows a schematic block circuit diagram of a device for actuating a FET, which bypasses an LED.

FIG. 1 shows a light-emitting diode (LED) 1, which is operated by a constant current source 2 with a current $I_d$. The LED 1 can be bypassed via a field-effect transistor (FET) 3 connected in parallel therewith if the gate voltage $U_g$ of the FET 3 is above the source potential $U_s$. In this case, the current $I_d$ is conducted practically exclusively via the low-resistance drain-source path of the FET 3 so that the LED 1 remains dark for the duration of the bypassing process. The source voltage or the source potential $U_s$ is generally "floating" in relation to ground in the case of a chain of series-connected LEDs 1 and, in the case of the first LED 1 closest to the constant current source 2, approximately corresponds to the total string voltage. The amplitude of a control signal present at a control line 4, which control signal is typically related to ground 5, is therefore generally insufficient for actuating and turning on the FET 3. In order to achieve this, the control signal can be related in a suitable manner to the source potential $U_s$ of the FET 3 by means of the present device 6.

The central element of the device 6 shown in FIG. 1 is a driver circuit 7 comprising a current mirror circuit 8, referred to below as current mirror 8 for short. The current mirror 8 comprises, for example, substantially one pair of pnp transistors 9, 10 and two series resistors 11, 12, preferably of the same magnitude, wherein a series resistor 11, 12 is connected upstream of each transistor 9, 10. The current mirror 8 corresponds to a current-controlled current source, i.e. the current $i_1$ flowing on an input side 13 (on the left-hand side in FIG. 1) is transmitted or "mirrored" onto an output side 14, with the usually relatively low base currents of the transistors 9, 10 being ignored. The base connections of the transistors 9, 10 are connected to one another and to the collector connection of the input-side transistor 9. The transistors 9, 10 therefore have an identical base-emitter voltage under the proviso that the series resistors 11, 12 are of equal magnitude. The base currents are therefore identical, from which it follows that the collector currents are approximately identical as well. Differences in the two collector currents which are conventional in practice owing to manufacturing tolerances, component tolerances, early effect, etc., of up to ±20% are virtually irrelevant for the functioning of the circuit and can be compensated for without any problems given correct dimensioning. The balancing properties of the current mirror 8, i.e. the correspondence of the input-side current $i_1$ and the output-side current $i_2$, can be improved by virtue of the fact that the transistors 9, 10 are embodied as a single double transistor, with the result that temperature-dependent differences can largely be ruled out, for example.

The input-side current $i_1$ is controlled by a level converter 15. The level converter 15 has an npn bipolar level converter transistor 16, whose base connection is connected to a PWM signal generator (for example microcontroller 17). The emitter connection of the level converter transistor 16 is related to ground 5 via a level converter resistor 18, with the result that the level converter transistor 16 together with the level converter resistor 18 forms a current sink, which impresses the input current $i_1$ on the collector connection of the level converter transistor 16. The impressed current $i_1$ follows the control signal present at the base connection, which is connected to the control line 4, which control signal is generated or controlled by the microcontroller 17 or any other desired voltage source, and is given by:

$$i_1 = \frac{U_{PWM} - U_{BET16}}{R_{18}}, \tag{1}$$

where $U_{PWM}$ is the control signal or the voltage at the control line 4, $U_{BET16}$ is the base-emitter voltage of the level converter transistor 16, and $R_{18}$ is the resistance value of the level converter resistor 18. The current mirror 8 mirrors the current $i_1$ flowing on the input side 13 onto the output side 14, where it flows, inter alia, via a gate resistor 19 between the gate connection and the source connection of the FET 3. The FET 3 is preferably an N-FET since this type has a particularly low-resistance drain-source path. The current $i_2$ flowing on the output side 14 results in a voltage drop along the gate resistor 19 and in a gate voltage $\Delta U_{R19}$ between the gate connection and the source connection of the FET 3, which is proportional to the resistance value $R_{19}$ of the gate resistor 19:

$$\Delta U_{R19} = i_2 \cdot R_{19} = \frac{U_{PWM} - U_{BET_{16}}}{R_{18}} \cdot R_{19}. \qquad (2)$$

The profile and the pulse shape of the gate voltage $\Delta U_{R19}$ in this case precisely follows the control signal $U_{PWM}$ at the level converter 15. In order that the FET 3 can be turned on completely using the control signal $U_{PWM}$, the resistance value $R_{19}$ of the gate resistor 19 needs to be sufficiently high to achieve a sufficient gate voltage $\Delta U_{R19}$ for the given current $i_2$. In particular, the amplitude of the gate voltage $\Delta U_{R19}$ needs to be greater than a threshold value voltage $U_{th}$ of the FET 3. Since the FET 3 is preferably an n-FET, this threshold value voltage $U_{th}$ is typically in the range between 2.5 and 3.5 V.

In total, the supply voltage $U_v$ needs to meet the following condition:

$$U_v \geq U_S + U_{th} + i_2 \cdot R_{12} + U_{CET_{10}} \qquad (3),$$

where $U_s$ is the source potential, $U_{th}$ is the threshold voltage of the FET 3, $i_2 R_{12}$ is the voltage drop across the output series resistor 12, and $U_{CET_{10}}$ is the collector-emitter saturation voltage of the output-side transistor 10 of the current mirror 8. It can be seen from this that the supply voltage $U_v$ always needs to be markedly above the source potential $U_s$ of the FET 3 to be actuated.

Since when the FET 3 is turned on, the voltage at the load, or in a specific case at the LED 1, could in certain situations approximately correspond to the operating voltage of the entire circuit, generally a charge pump or a step-up or boost converter is required as voltage source 20 for generating the supply voltage $U_v$.

The collector resistor 21 connected between the current mirror 8 and the level converter 15 has no reference to the current formation or current mirroring, but is used only for reducing the power loss in the level converter transistor 18, which can arise in the case of an excessively high supply voltage $U_v$.

Figure 2:
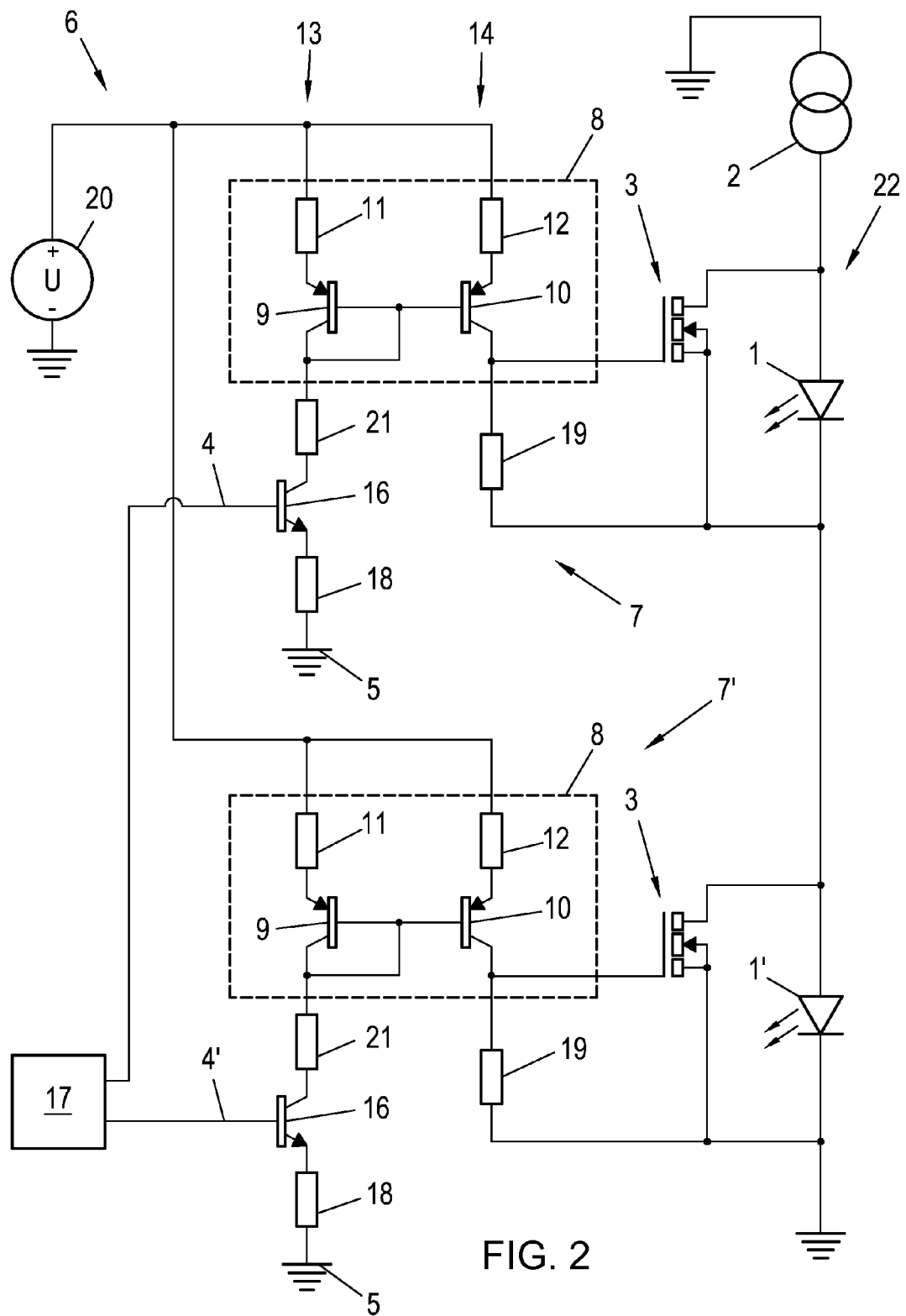
FIG. 2 shows a preferred exemplary embodiment comprising two separately drivable FETs, wherein the two assigned driver circuits are connected to a common supply voltage.

FIG. 2 shows a lighting device 22 comprising two series-connected LEDs 1, 1' using a schematic block circuit diagram. In each case one bypassing element in the form of an N-MOSFET, referred to below as FET 3 for short, is assigned to the two LEDs 1, 1', wherein the FETs 3 are connected in parallel with the respective LED 1. Each of the two FETs 3 is connected to a dedicated driver circuit 7, 7', which are each connected to a dedicated control line 4, 4'. The control signals are generated, for example, by a common microcontroller 17 and are therefore related to ground 5. In general, the time profile of the control signals is independent, so that the LEDs 1, 1' are actuable separately from one another.

The two LEDs 1, 1' are supplied by a common constant current source 2. The constant current source 2 can be, for example, a step-down or buck converter in the form of a current controller. In general, it is at the discretion of a person skilled in the art to provide a power supply suitable for a string of series-connected, individually bypassable LEDs. The driver circuits 7, 7' are supplied, independently of the constant current source 2, by a common voltage source 20, which provides a supply voltage $U_v$. Otherwise, the design of the individual driver circuits 7, 7' is substantially identical to the driver circuit 7 described in connection with FIG. 1, so that, in order to avoid repetition, reference is additionally made to the above details for the description of the individual elements.

In the exemplary application case illustrated here, a current of 1 A is supplied to the LEDs 1 by the constant current source 2, which is preferably in the form of a step-down converter. The supply voltage $U_v$ of the driver circuits 7, 7' is in this case a DC voltage of 30 V and generally needs to satisfy inequation (3) cited above, in particular always needs to be higher than the LED chain voltage plus sufficient gate actuation voltage for the specifically used FETs 3. The required gate actuation voltage can conventionally be gleaned from the data sheet for the FETs 3 and is typically in the region of 5 V for logic-level FETs or greater than 7 V for conventional MOSFETs. In order to achieve symmetrical current mirrors 8, the series resistors 11, 12 are equal in magnitude and each have a resistance of 100Ω, and the mirror transistors 9, 10 are identical in terms of design. The level converter resistors 18 in this example have a resistance of 2.2 kΩ and are equal in magnitude to the gate resistors 19. Thus, in the case of the gate-source path of the FETs 3, approximately the same control voltage is set as is provided at the output of the signal source, or in this case the microcontroller 17. The collector resistors 21 used for protecting the level converter transistors 16 each have a resistance value of 8.2 kΩ.

The time profile of the currents through the LEDs 1, 1' corresponds in the circuit shown in FIG. 2 to the time profile of the voltages at the respectively assigned control lines 4, 4', but with the reverse mathematical sign: the actuation is inverting owing to the design of the circuit. If a control line 4, 4' is at a "high" logic level, the respective driver circuit 7, 7' ensures bypassing of the LED 1, 1' via the FET 3 and therefore results in a lower current across the LED 1 or 1'. In contrast to bootstrap circuits, the present device 6 transmits the control signals randomly to the FETs 3 so that permanent switching-on or switching-off of the FETS 3 with a "PWM signal" with a 100% or 0% duty factor is also possible; a corresponding source 20 for the supply voltage (for example a boost converter) is assumed.

It can be seen from the exemplary embodiments that the circuit can be implemented easily and follows simple dimensioning rules. Matching to the respectively present circumstances can therefore be realized quickly and reliably by a person skilled in the art. In particular, the maximum voltage drop between the gate connection and the source connection of the FETs 3 can be determined easily on the basis of the resistance values and the constant supply voltage $U_v$, and no voltage limitation of the gate connection, which would generally need to be implemented using a Zener diode, is necessary, given correct dimensioning. All of the component parts used are integratable and integrated component parts or multiple housings (for example resistor arrays, double transistors, etc.) can be used for most circuit elements. As a result, the design is compact, takes up little printed circuit board area and in addition is comparatively cost-efficient to manufacture.

Even if the described exemplary embodiments only expressly demonstrate applications with one or two LEDs 1, an application of the device according to the invention in conjunction with longer LED strings and also a plurality of parallel LED strings (for example an LED matrix) can be seen directly from this. The adaptations required in this connection can be implemented using the above-described, universally valid relationships.

The invention claimed is:

1. A device for LED actuation corresponding to a control signal present at a control line, the device comprising:
   at least one field-effect transistor (FET) for bypassing at least one respective light-emitting diode, said at least one field-effect transistor having a gate connection, a source connection and a drain connection and being an N-channel FET with a floating source potential with respect to the control line;

at least one driver circuit including a current mirror having an input side and an output side for transmitting a current flowing on said input side to said output side, said input and output sides being connected to a supply voltage;

said current mirror including a transistor pair having an input-side transistor and an output-side transistor with base connections connected to one another and to a collector connection of said input-side transistor;

a level converter formed by a current sink and connecting said input side of said current mirror to the control line in order to impress a current being dependent on a voltage of the control signal;

said output side of said current mirror being connected to the gate connection and to the source connection of said at least one field-effect transistor; and a gate resistor connected between the gate connection and the source connection of said at least one FET.

2. The device according to claim 1, wherein said transistor pair is a double transistor.

3. The device according to claim 1, wherein said current sink has a level converter transistor and a level converter resistor, said level converter transistor is connected in series with said input side of said current mirror, and said level converter transistor has an emitter connection related to ground via said level converter resistor and a base connection connected to the control line.

4. The device according to claim 3, which further comprises a collector resistor connected between said level converter transistor and said input side of said current mirror for reducing a power loss at said level converter transistor.

5. The device according to claim 1, which further comprises an input series resistor connected between said input side of said current mirror and the supply voltage and an output series resistor connected between said output side of said current mirror and the supply voltage.

6. The device according to claim 1, which further comprises an input series resistor connected between said input side of said current mirror and the supply voltage.

7. The device according to claim 1, which further comprises an output series resistor connected between said output side of said current mirror and the supply voltage.

8. The device according to claim 1, which further comprises a charge pump or a boost converter supplying an output voltage being the supply voltage.

9. The device according to claim 1, wherein said at least one field-effect transistor includes two or more field-effect transistors, and said at least one driver circuit includes two or more driver circuits having a common supply voltage, being connected in parallel, and actuating said field-effect transistors.

10. The device according to claim 9, wherein said two or more field-effect transistors are each connected in parallel with a respective LED disposed in at least one series circuit.

* * * * *